(12) United States Patent
Imonigie et al.

(10) Patent No.: US 11,393,688 B2
(45) Date of Patent: Jul. 19, 2022

(54) SEMICONDUCTOR CONTACT FORMATION (71) Applicant: Micron Technology, Inc., Boise, ID (US)

(72) Inventors: Jerome A. Imonigie, Boise, ID (US); Guangjun Yang, Meridian, ID (US); Anish A. Khandekar, Boise, ID (US); Yoshitaka Nakamura, Boise, ID (US); Yi Fang Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 84 days.

(21) Appl. No.: 16/984,377

(22) Filed: Aug. 4, 2020

(65) Prior Publication Data
US 2022/0045195 A1 Feb. 10, 2022

(51) Int. Cl.
*H01L 21/28* (2006.01)
*H01L 29/66* (2006.01)
*H01L 27/108* (2006.01)
*H01L 21/311* (2006.01)

(52) U.S. Cl.
CPC ........ *H01L 21/28008* (2013.01); *H01L 21/28088* (2013.01); *H01L 21/31116* (2013.01); *H01L 27/10873* (2013.01); *H01L 29/66666* (2013.01)

(58) Field of Classification Search
None
See application file for complete search history.

(56) References Cited

U.S. PATENT DOCUMENTS

| | | | |
|---|---|---|---|
| 6,355,532 B1 * | 3/2002 | Seliskar | B82Y 10/00 257/E21.404 |
| 7,710,765 B2 | 5/2010 | Hanafi | |
| 8,409,959 B2 | 4/2013 | El-Kareh et al. | |
| 10,607,995 B2 | 3/2020 | Roberts et al. | |
| 2009/0108340 A1 * | 4/2009 | Seo | H01L 29/4236 257/329 |
| 2009/0191389 A1 * | 7/2009 | Guiheen | H01B 1/16 428/212 |

(Continued)

OTHER PUBLICATIONS

U.S. Appl. No. 16/204,224, entitled, "Memory Arrays," filed Nov. 29, 2018, 43 pages.

*Primary Examiner* — Eva Y Montalvo
*Assistant Examiner* — Kevin Quinto
(74) *Attorney, Agent, or Firm* — Brooks, Cameron & Huebsch, PLLC (57) ABSTRACT

Systems, methods and apparatus are provided for a semiconductor structure. An example method includes a method for forming a contact surface on a vertically oriented access devices. The method includes forming a first source/drain region and a second source/drain region vertically separated by a channel region, forming a sacrificial etch stop layer on a first side of the second source/drain region, wherein the channel region is in contact with a second side of the second source/drain region, forming a dielectric layer on a first side of the sacrificial etch stop layer, where the second source/drain region is connected to a second side of the sacrificial etch stop layer, removing the dielectric layer using a first etch process to expose the sacrificial etch stop layer, and removing the sacrificial etch stop layer using a second etch process to form a contact surface on the second source/drain region.

20 Claims, 8 Drawing Sheets (56) References Cited

U.S. PATENT DOCUMENTS

| | | | |
|---|---|---|---|
| 2009/0225588 A1* | 9/2009 | Czubatyj | H01L 45/1273 |
| | | | 365/163 |
| 2016/0203988 A1* | 7/2016 | Zhao | H01L 29/513 |
| | | | 257/392 |
| 2018/0323200 A1 | 11/2018 | Tang et al. | |
| 2019/0103406 A1 | 4/2019 | Tang et al. | |
| 2019/0164985 A1 | 5/2019 | Lee et al. | |

* cited by examiner

SEMICONDUCTOR CONTACT FORMATION

TECHNICAL FIELD

The present disclosure relates generally to semiconductor devices and methods, and more particularly to formation of a semiconductor contact.

BACKGROUND

Memory devices are typically provided as internal, semiconductor, integrated circuits in computers or other electronic devices. There are many different types of memory, including random-access memory (RAM), read only memory (ROM), dynamic random-access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

As design rules to memory devices shrink, semiconductor structure fabrication processes may become more complex. Further, with shrinking design rules, expected memory device performance may be more difficult to achieve. Shrinking design rules may even decrease the reliability of memory cells.

DETAILED DESCRIPTION

Various types of semiconductor fabrication processes are used to form, e.g., construct, memory devices such as those that include volatile or non-volatile memory cells. The semiconductor fabrication processes may include forming, patterning, and/or removing various portions of semiconductor material on a working surface of semiconductor material, on a substrate, at various points in time in the fabrication process. The semiconductor fabrication processes may include deposition processes, e.g., chemical vapor deposition (CVD), plasma deposition, doping, patterning processes, e.g., using photolithographic techniques, and etching processes, e.g., vapor, wet and/or dry etch processes, in order to form semiconductor structures on a substrate. As design rules shrink, the desired or intended result of semiconductor structure fabrication processes may become more difficult to achieve.

In one example embodiment, vertical access device, e.g., transistor, pillars may be formed to increase the number of access devices in a given area. In one example of a dynamic random access memory (DRAM) cell, e.g., a one transistor, one capacitor (1T1C) cell, a storage node may be formed above a vertical, pillar access device. Reliable electrical contact is to be made between the storage node and a source/drain region of the vertical access device, even in smaller dimension with each product generation, if reliable operation of the memory cell is to be achieved. As the operational power supplies and read/write signals magnitudes decrease, the performance expectation for electrical interfaces between discrete connections increases.

In one example embodiment, vertical access devices are formed as pillars between digit lines formed beneath and storage nodes formed above in multiple vertical layers according to semiconductor fabrication processes. The vertical access devices may each extend substantially vertically from a working surface on a semiconductor substrate material on which they are positioned.

Various deposition, patterning, and removal, e.g., etching, processes may be used to form the vertical access devices having a first source/drain region, a channel region, and a second source/drain region. According to embodiments, protective materials and specific removal chemistries may be used to expose a contact surface to form electrical contact between the vertical access device and a storage node in a semiconductor fabrication process. For example, an improved electrical contact surface is provided to a source/drain region of a vertical access device pillar such that an improved electrical contact to a storage node, e.g., a cell contact to an electrode of a capacitor cell, can be formed and improved performance can be realized. These and other embodiments will be evident from reading the present disclosure herein.

As design rules scale to smaller dimensions, deeper openings or trenches with more narrow widths, e.g., higher aspect ratios (A/R), may be used to fit more access devices within a smaller area. In result, the area for making electrical contact, e.g., contact surface, between discrete components becomes smaller. Further, it may be more difficult to form contact surface on source/drain regions while maintaining a quality of electrical interface between discrete components. Dielectric layers may be formed over a source/drain region of an access device for protection during subsequent semiconductor fabrication processes. However, removing the dielectric layer to expose an electrical contact region, e.g., contact surface, may cause damage to a surface and electrical interface on the source/drain region during the dielectric removal process to expose the contact surface.

In one example embodiment of the present disclosure, a particular material composition, to serve as a sacrificial etch stop layer, is formed on a surface and electrical interface of the source/drain region, before a protective dielectric layer is deposited, in order to protect the electrical interface quality of a contact surface to the source/drain region when the dielectric layer is being removed.

The present disclosure includes methods, apparatuses, and systems related to minimizing the damage on a source/drain region during the removal of the dielectric layer when forming a contact surface. An example method includes forming a first source/drain region and a second source/drain region vertically separated by a channel region, forming a sacrificial etch stop layer on a first side of the second source/drain region, where the channel region is in contact with a second side of the second source/drain region, forming a dielectric layer on a first side of the sacrificial etch stop layer. The second source/drain region is connected to a second side of the sacrificial etch stop layer. The dielectric layer is removed using a first etch process to expose the sacrificial etch stop layer. The sacrificial etch stop layer is removed using a second etch process to expose a contact surface on the second source/drain region.

The term semiconductor may refer to, for example, a material, a wafer, or a substrate, and includes any base semiconductor structure. "Semiconductor" is to be understood as including silicon-on-sapphire (SOS) technology, silicon-on-insulator (SOI) technology, thin-film-transistor (TFT) technology, doped and undoped semiconductors, epitaxial silicon supported by a base semiconductor structure, as well as other semiconductor structures. Furthermore, when reference is made to a semiconductor in the preceding description, previous process steps may have been utilized to form regions/junctions in the base semiconductor structure, and the term semiconductor may include the underlying materials containing such regions/junctions.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein may be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, designators such as "N," "M," etc., particularly with respect to reference numerals in the drawings, indicate that a number of the particular feature so designation may be included. It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of pillars may refer to one or more memory arrays), whereas a "plurality of" is intended to refer to more than one of such things. As used herein, multiple acts being performed concurrently refers to acts overlapping, at least in part, over a particular time period. Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically and, unless stated otherwise, may include a wireless connection for access to and/or for movement (transmission) of instructions (e.g., control signals, address signals, etc.) and data, as appropriate to the context. The term coupled may further include two or more elements that co-operate or interact with each other (e.g., as in a cause and effect relationship). An element coupled between two elements may be between the two elements and coupled to each of the two elements.

It should be recognized the term vertical accounts for variations from "exactly" vertical due to routine manufacturing, measuring, and/or assembly variations and that one of ordinary skill in the art would know what is meant by the term "perpendicular." For example, the vertical may correspond to the z-direction. As used herein, when a particular element is "adjacent to" another element, the particular element may cover the other element, may be over the other element or lateral to the other element and/or may be in direct physical contact the other element. Lateral to may refer to the horizontal direction (e.g., the y-direction or the x-direction) that may be perpendicular to the z-direction, for example.

Although specific embodiments have been illustrated and described herein, those of ordinary skill in the art will appreciate that an arrangement calculated to achieve the same results may be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

Figure 1A:
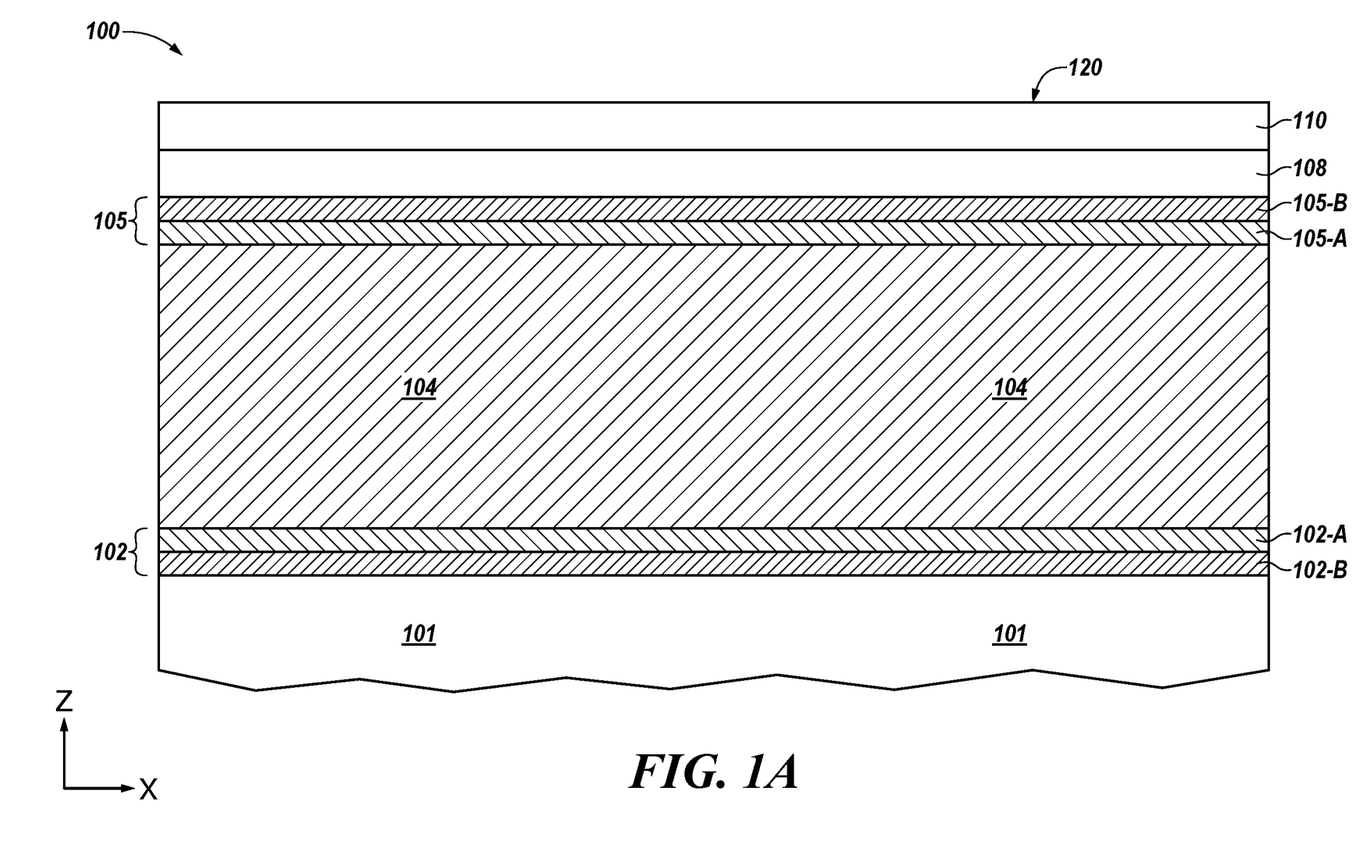
FIG. 1A is a cross-section view of a semiconductor structure at a particular point in time in an example semiconductor fabrication process in accordance with a number of embodiments of the present disclosure.
Figure 2:
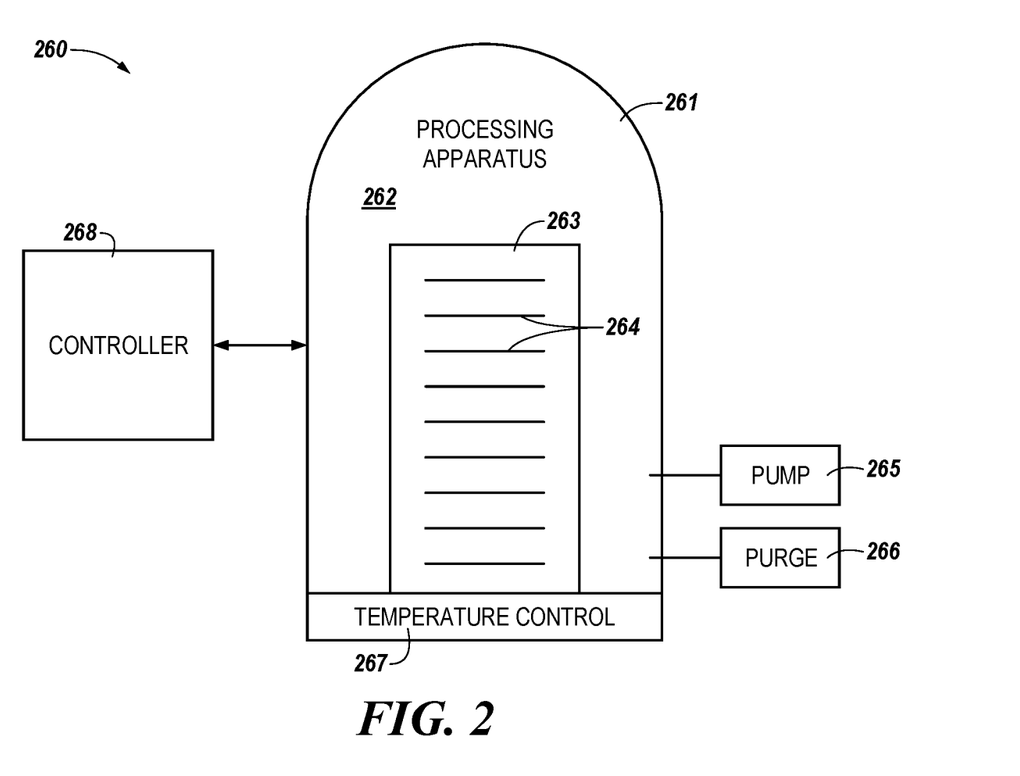
FIG. 2 is an example of a semiconductor fabrication apparatus as can be used with a process in accordance with a number of embodiments of the present disclosure.

FIG. 1A is a cross-section view of a semiconductor structure at a particular point in time in an example semiconductor fabrication process 100 in accordance with a number of embodiments of the present disclosure. FIG. 1A illustrates an example method, at one stage of a semiconductor fabrication process, for forming arrays of vertically stacked memory cells having vertical pillar access devices. In the example embodiment shown in the example of FIG. 1A, the method comprises depositing a first semi-conductive material 102-B, e.g., layer, on a working surface of a semiconductor substrate material 101. A substrate material 101 may be formed from various undoped or doped materials on which memory device materials, components, and/or structures may be fabricated. Examples of a relatively inert undoped substrate material 101 may include monocrystalline silicon (monosilicon), polycrystalline silicon (polysilicon), and amorphous silicon, polycrystalline germanium, amorphous germanium, poly-silicon germanium (poly-SiGe), among other possibilities. In the course of a semiconductor fabrication process multiple layers and structures may be formed, e.g., deposited, patterned, and/or removed on the substrate material 101. Indeed, in the course of semiconductor fabrication many different components may be formed in different layers of an evolving working surface in a semiconductor fabrication process. For example, as will be noted further below, in one example embodiment conductive digit line structures and paths may be formed beneath and prior to the semiconductor fabrication process shown on the working surface and substrate material 101 illustrated in FIG. 1A. As used herein, a working surface of substrate material 101 is not limited to a single composition or material. In fact, a working surface at different points in a semiconductor fabrication process may be a resulting structure after previous, different materials have been deposited, patterned, and/or removed, e.g. using photolithographic techniques and various deposition and etching processes. In this disclosure a working surface may be patterned, e.g., using a photolithographic mask, which may be later removed, to form openings, deposit layers, etc. Various processing apparatus, such as shown in FIG. 2, may be used under different processing parameters to form structures described herein on a working surface of substrate material 101.

As shown in the example of FIG. 1A, a first semiconductor material 102-B, e.g., layer, (referred to later herein as "second region to a first source/drain region" as being a layer of the first source/drain farther away from a later formed channel region) is deposited on the working surface of the substrate material 101. A second semiconductor material 102-A, e.g., layer (referred to later herein as "first region to the first source/drain region" as being closer to a later formed channel region) may then be deposited on the first semiconductor material 102-B. As will be explained in further detail below, the first semiconductor material 102-B and the second semiconductor material 102-A may serve as a composite, multi-layer first source/drain region 102 for a vertical access device, e.g., transistor. By way of example and not by way of limitation, the first and the second semiconductor materials, 102-B and 102-A, may be deposited using a plasma vapor deposition (PVD) process, implemented in a semiconductor fabrication apparatus such as shown in FIG. 2. Embodiments, however, are not limited to a PVD deposition process and other suitable techniques may be used to deposit the first and the second semiconductor materials 102-B and 102-A. Further, while two layers will be referenced in the example embodiments described herein as being formed into a source/drain regions, embodiments are not so limited. More or fewer layers in a multi-layer semiconductor material may be included in source/drain region 102.

In one example, the first semiconductor material 102-B may be formed from at least one of indium oxide ($In_2O_3$) (also referred to herein as "InOx"), indium tin oxide ($InSn_xO_y$) (also referred to herein as "ITO"), indium zinc oxide ($InZn_xO_y$), and/or zinc oxide (ZnO). The first semiconductor material 102-B may be deposited to have a vertical thickness, shown by the vertical axes in the "z" direction, in a range of ten (10) to seventy (70) Angstroms (Å). In one example embodiment, first semiconductor material 102-B is formed to a thickness of approximately 50 Å. In this example, the second semiconductor material 102-A may be formed from an indium gallium zinc oxide ($In_2Ga_2ZnO_7$) material (also referred to herein as "IGZO") having a low oxygen concentration. The second semiconductor material 102-A may also be deposited to have a vertical thickness, shown by the vertical axes in the "z" direction, in a range of ten (10) to seventy (70) Angstroms (Å). In one example embodiment, the second semiconductor material 102-A is formed to a thickness of approximately 50 Å.

As shown in the example embodiment of FIG. 1A, a third semiconductor material 104 (referred to later herein as "channel region") may next be deposited on the second semiconductor material 102-A. The third semiconductor material 104 may later be patterned and formed into a channel region to a vertical access device. The third semiconductor material 104 may be deposited using a PVD process. In one example embodiment, the third semiconductor material 104 may be formed from an indium gallium zinc oxide ($In_2Ga_2ZnO_7$) material ("IGZO"). In this example the third semiconductor material 104 may be deposited to have a vertical thickness in a range of 300 to 500 Å. In one embodiment, the third semiconductor material 104 is deposited to a thickness of approximately 400 Å.

As shown in the example of embodiment of FIG. 1A, the symmetry of the material deposition may be repeated on the other side of the third semiconductor material 104 with a fourth semiconductor material 105-A, e.g., layer, (referred to later herein as "first region to a second source/drain region" as being closer to a formed channel region) being deposited on the third semiconductor material 104. The fourth semiconductor material 105-A can be deposited on the third semiconductor material 104 using a PVD process. According to the symmetry, the fourth semiconductor material 105-A may be formed from an IGZO material having a low oxygen concentration. In some embodiments, the fourth semiconductor material 105-A, e.g., first region of the second source/drain region, may be formed of the same material as the second semiconductor material 102-A, e.g., first region of the first source/drain region. In some examples, forming the fourth semiconductor material 105-A from the same material as the second semiconductor material 102-A may provide an electrically stable access device. The fourth semiconductor material 105-A may also be deposited to have a vertical thickness, shown by the vertical axes in the "z" direction, in a range of ten (10) to seventy (70) Angstroms (Å). In one example embodiment, the fourth semiconductor material 105-A is formed to a thickness of approximately 50 Å.

A fifth semiconductor material 105-B, e.g., layer, (referred to later herein as "second region to a second source/drain region" as being further from a formed channel region) may be deposited on the fourth semiconductor material 105-A. The fifth semiconductor material 105-B can be deposited on the fourth semiconductor material 105-A using a PVD process. Embodiments, however, are not limited to PVD deposition techniques. According to the symmetry, the fifth semiconductor material 105-B may be formed from at least one of indium oxide ($In_2O_3$) (also referred to herein as "InOx"), indium tin oxide ($InSn_xO_y$) (also referred to herein as "ITO"), indium zinc oxide ($InZn_xO_y$), and/or zinc oxide (ZnO). In some embodiments, the fifth semiconductor material 105-B, e.g., second region of the second source/drain region, may be formed of the same material as the first semiconductor material 102-B, e.g., second region of the first source/drain region. In some examples, forming the fifth semiconductor material 105-B from the same material as the first semiconductor material 102-B may provide an electrically stable access device. The fifth semiconductor material 105-B may be deposited to have a vertical thickness, shown by the vertical axes in the "z" direction, in a range of ten (10) to seventy (70) Angstroms (Å). In one example embodiment, fifth semiconductor material 105-B is formed to a thickness of approximately 50 Å. The fifth semiconductor material 105-B and the fourth semiconductor material 105-A may serve as a composite, multi-layer second source/drain region 105 for a vertical access device, e.g., transistor. Again, while two layers will be referenced in the example embodiments described herein as being formed into a source/drain regions, embodiments are not so limited. More or fewer layers in a multi-layer semiconductor material may be included in composite source/drain region 105.

As shown in the example embodiment of FIG. 1A, a sixth material 108, e.g., layer, (referred to later herein as "sacrificial etch stop layer") is deposited on the fifth semiconductor material 105-B. According to embodiments, the sixth material 108 will serve as a sacrificial etch stop layer (SESL) in a semiconductor fabrication removal process to expose a contact surface to the fifth semiconductor material 105-B when later formed herein into a discrete second source/drain region of a vertically oriented access device pillar. The sixth material 108 may be deposited using a PVD process. In some example embodiments, the sacrificial etch stop layer 108 comprises a metallic oxide material. In one example, the sacrificial etch stop layer 108 may comprise a gallium oxide ($Ga_2O_3$) material (also referred to herein as "GaOx"). In one example, the sacrificial etch stop layer 108 may be a tungsten (W) material and may be a W material deposited using a chemical vapor deposition (CVD) process, e.g., CVD-W. In one example, the sacrificial etch stop layer 108 may comprise a zinc oxide (ZnO) material, a titanium nitride (TiN) material, a silicon (Si) material, a phosphorous-doped silicon (Si) material, or a boron-doped silicon (Si) material. Embodiments, however, are not limited to these example materials for the sacrificial etch stop layer 108. In one example embodiment, the sacrificial etch stop layer 108 may be deposited to have a vertical thickness in a range of ten (10) to seventy (70) Angstroms (Å). In one example embodiment, sacrificial etch stop layer 108 is formed to a thickness of approximately 50 Å.

As shown in the example embodiment of FIG. 1A, a sacrificial etch stop layer 108 is formed on the second source/drain region materials, e.g., on the second region 105-B. In one embodiment, the sacrificial etch stop layer 108 is deposited on the second region 105-B of the second source/drain region materials 105 using a chemical vapor deposition (CVD) process. For example, the sacrificial etch stop layer 108 may be on a first side, e.g., top surface, of a later formed second source/drain region 105 and a later formed channel region 104 may be on the second side, e.g., bottom surface, of the second source/drain region 105. Embodiments, however, are not limited to this example and other suitable semiconductor fabrication techniques may be used to form the sacrificial etch stop layer 108. For example, in some embodiments, the sacrificial etch stop layer 108 is deposited on the second region 105-B of the second source/drain regions 105 using a plasma vapor deposition (PVD) process.

According to embodiments, the sacrificial etch stop layer 108 may protect a later, discretely formed second source/drain region 105, and particularly an electrical contact surface to be formed on the first side, e.g., top surface, of the second source/drain region 105, from chemicals that may cause harm to the second source/drain region 105 in subsequent semiconductor fabrication process steps to expose the first side, e.g., top surface, of the second source/drain region 105 during an etching and material removal process. For example, the sacrificial etch stop layer 108 may protect the second source/drain region 105 from chemical vapors and/or liquids that are released during an etch process.

As shown in the example embodiment of FIG. 1A, a seventh material 110 e.g., first dielectric layer, may be formed on the sacrificial etch stop layer 108. In one example, the first dielectric layer 110 may be deposited using PVD process. Embodiments, however, are not limited to this example and other suitable semiconductor fabrication techniques such as chemical vapor deposition (CVD) may be used to form the dielectric layer 110.

In some embodiments, the first dielectric layer 110 is deposited to protect the later formed second source/drain region 105 during subsequent semiconductor fabrication processes. By way of example, and not by way of limitation, the first dielectric layer 110 may comprise a silicon nitride ($Si_3N_4$) material (also referred to herein a "SiN"). In another example, the dielectric layer 110 may comprise a silicon dioxide ($SiO_2$) material. In another example the dielectric layer 110 may include silicon oxy-nitride ($SiO_xN_y$) material (also referred to herein as "SiON"), and/or combinations thereof. Embodiments are not limited to these examples.

Figure 1B:
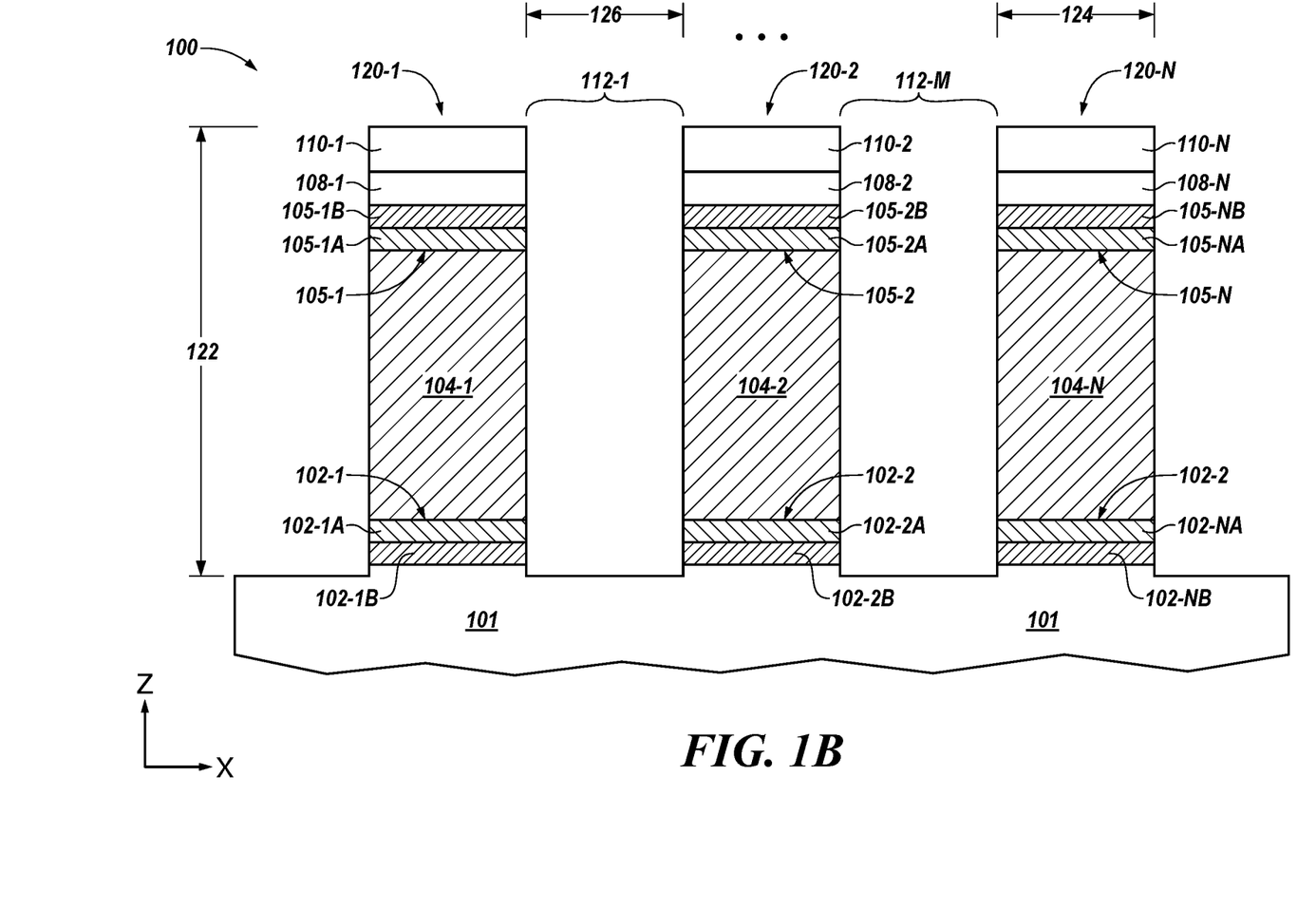
FIG. 1B is a cross-section view of a semiconductor structure at a particular point in time in an example semiconductor fabrication process in accordance with a number of embodiments of the present disclosure.

FIG. 1B is a cross-section view of a semiconductor structure at a particular point in time in an example semiconductor fabrication process 100 in accordance with a number of embodiments of the present disclosure. In the example of FIG. 1B, the semiconductor stack shown in FIG. 1A has been patterned, using photolithographic techniques such as carbon and anti-reflective-coating (ARC) deposition and masking, to expose columns of the material stack along a "y" direction of the coordinate axes, in to and out from a plane of the drawing sheet. The exposed columns of the material stack along the "y" direction have been removed using an etching process to form a plurality of openings, 112-1, . . . , 112-M, separating a plurality of vertical access device pillars, 120-1, 120-2, . . . , 120-N, in the "y" direction, in to and out from the plane of the drawing sheet, of the material stack described in connection with FIG. 1A. According to embodiments, the plurality of vertical access device pillars, 120-1, 120-2, . . . , 120-N (which may also be independently or collectively referred to herein as "120").

As shown in FIG. 1B, each of the plurality of pillar columns 120 extending lengthwise in to and out from the plane of the drawing sheet in the "y" direction, includes the stack of the first semiconductor material 102-B, second semiconductor material 102-A, third semiconductor material 104, fourth semiconductor material 105-A, fifth semiconductor material 105-B, sacrificial etch stop layer 108, and dielectric layer 110, shown respectively for each pillar column. In one embodiment, the stack material may be removed to form the openings 112-1, . . . , 112-M, separating the vertical access device pillars 120-1, 120-2, . . . , 120-N, using a dry etch process. Embodiments, however, are not limited to this example. The masks can then be removed to show the structure in FIG. 1B. In one example, a height (H) 122 of the columns of vertical access device pillars 120 may be in a range of thirty (30) to two hundred (200) nanometers (nm). In this example, a width (W1) 124 of the columns of vertical access device pillars 120 may be in a range of ten (10) to fifty (50) nm. The openings 112-1, . . . , 112-M (also collectively referred to as "112") in FIG. 1B, separating the vertical access device pillars 120 may have a width (W2) 126 in a range of one-hundred (100) to two-hundred (200) nm. Embodiments, however, are not limited to these examples.

Figure 1C:
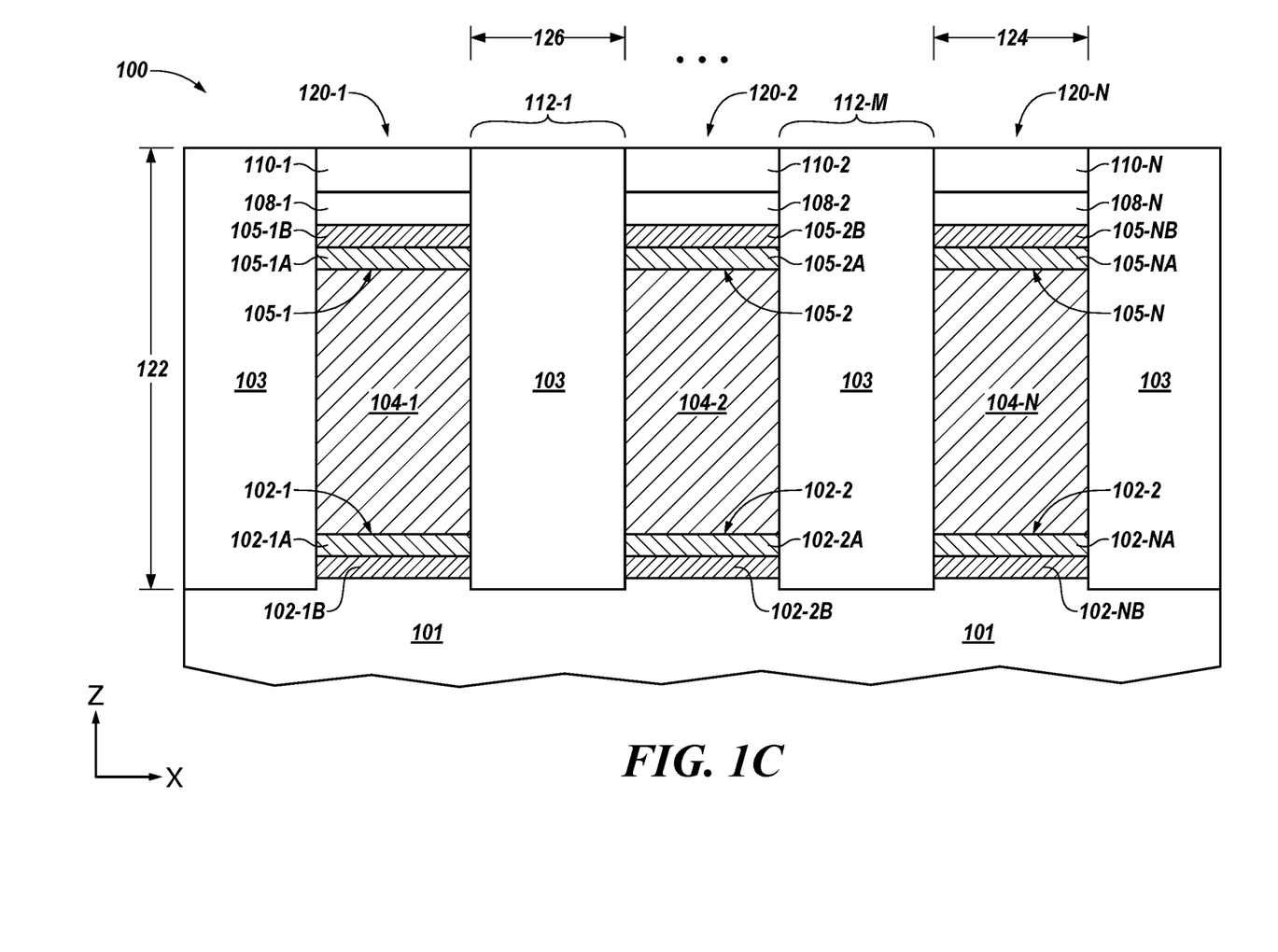
FIG. 1C is a cross-section view of a semiconductor structure at a particular point in time in an example semiconductor fabrication process in accordance with a number of embodiments of the present disclosure.

FIG. 1C is a cross-section view of a semiconductor structure at a particular point in time in an example semiconductor fabrication process 100 in accordance with a number of embodiments of the present disclosure. The fabrication process 100 illustrated in FIG. 1C is shown at a point in time that corresponds to various processing activities already having been performed in the fabrication process 100, e.g., subsequent to the structure shown in FIG. 1B As shown in FIG. 1C, an insulator material 103 may be deposited to fill the openings 112 separating the columns of vertical access device pillars 120. In one embodiment, the insulator material 103 can be an oxide such as silicon dioxide ($SiO_2$). In one embodiment, the insulator material 103 can be deposited to fill the openings using a spin on dielectric (SOD) process followed by an SOD densification and chemical mechanical planarization (CMP) of the SOD above the columns of vertical access device pillars 120. In one embodiment, a oxide material may also be deposited at a periphery of the pillars using an $SiO_2$ material deposited using an atomic layer deposition (ALD) to a thickness in a range of approximately 50 to 80 Å.

Figure 1D:
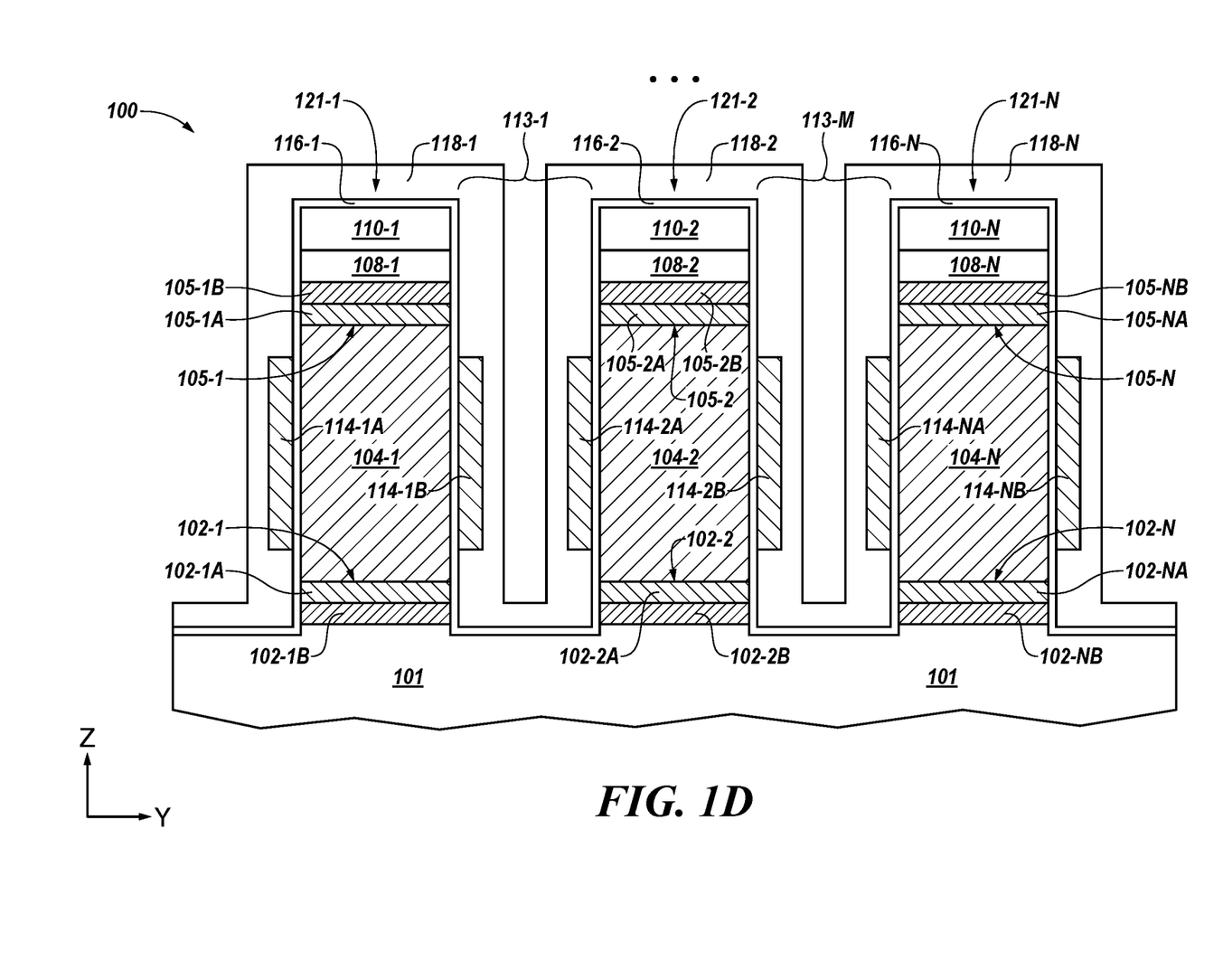
FIG. 1D is a cross-section view of a semiconductor structure at a particular point in time in an example semiconductor fabrication process in accordance with a number of embodiments of the present disclosure.

FIG. 1D is a cross-section view of a semiconductor structure at a particular point in time in an example semiconductor fabrication process 100 in accordance with a number of embodiments of the present disclosure. In the example embodiment of FIG. 1D, the structure shown in FIG. 1C has been rotated ninety degree (90°) in the "x-y" plane of the coordinate axes such that the "y" direction is now illustrated extending in a direction left to right in the plane of the drawing sheet. The illustration of the semiconductor stack shown in FIG. 1C, including the columns of vertical access device pillars, has been rotated 90° in the illustration of FIG. 1D in order to orthogonally separate the columns of vertical access devices into separate pillars of vertical access devices. For example, different materials such as nitride materials, e.g., silicon nitride (SiN), may be deposited to suitable, particular thickness such as approximately 50 Å along with masks, and photolithographic techniques may be used such that a working surface may be patterned, extending in the "x" direction in to and out from the plane of the drawing sheet and orthogonal to the "y" direction, to form openings 113-1, 113-2, . . . , 113-M, separating the columns of vertical access device pillars 120, shown in FIG. 1C, into individual, vertical access device pillars 121-1, 121-2, . . . , 121-N (also individually and/or collectively referred to as "121") as shown in FIG. 1D.

In one embodiment, a carbon mask may be formed and the columns of vertical access device pillars 121 may be separated using a dry etch process to etch through the layers of semiconductor materials in the semiconductor stack extending in the "x" direction orthogonal to the "y" direction. Each of the individual vertical access device pillars 121-1, 121-2, . . . , 121-N as shown in FIG. 1D is now separated along the "x" and "y" directions and includes the stack of the first semiconductor material 102-B, second semiconductor material 102-A, third semiconductor material 104, fourth semiconductor material 105-A, fifth semiconductor material 105-B, sacrificial etch stop layer 108, and first dielectric material 110, shown respectively for each pillar 121. The first and second semiconductor materials 102-A and 102-B, respectively for each individual pillar 121, may now be collectively be referred to as a composite, multi-layer first source/drain regions for each respective pillar 121. The third semiconductor material 104, respectively for each individual pillar 121, may now collectively be referred to a channel region 104 for each respective pillar 121. And, the fourth and fifth semiconductor materials 105-A and 105-B, respectively for each individual pillar 121, may now be collectively be referred to as a composite, multi-layer second source/drain regions for each respective pillar 121. In some embodiments, a height and width of the individual, vertical access device pillars 121 along the "y" direction may be equivalent and symmetrical to the height and width of the columns of vertical access device pillars 120 described in connection with FIG. 1C.

As shown in the embodiment of FIG. 1D, each respective one of the individual, vertical access device pillars 121 still includes the etch stop layer 108 formed on the second region 105-B of the second source/drain region 105 and the first dielectric material 110 formed on the etch stop layer 108.

In some embodiments, the openings 113 may be formed through the working surface of the semiconductor stack using selective oxide etching chemistries. By way of example the selective oxide etching chemistries may include: a fluorine based vapor and/or plasma etch (e.g., using gases like $NF_3$, $NF_3/NH_3$/Ar, HBr, $CHF_3$), or SiConi™ clean. As a result, the vertical access device pillars 121 comprising first source/drain regions 102-1, 102-2, . . . , 102-N (which may also be independently or collectively referred to herein as "102") and second source/drain regions 105-1, 105-2, . . . , 105-N (which may also be independently or collectively referred to herein as "105") separated vertically by a channel regions 104-1, 104-2, . . . , 104-N (which may also be independently or collectively referred to herein as "104") remain with a sacrificial etch stop layer 108-1, 108-2, . . . , 182-N (which may also be independently or collectively referred to herein as "108") formed on the second source/drain regions 105 and a protective first dielectric layers 110-1, 110-2, . . . , 110-N (which may also be independently or collectively referred to herein as "110") formed on the sacrificial etch stop layer 108.

As shown in the example embodiment of FIG. 1D, a gate dielectric, 116-1, 116-2, . . . 116-N (also referred to individually and/or collectively as "116"), associated with each pillar 121 may be deposited in the openings 113 along sidewalls of the individual vertical access device pillars 121. In one example embodiment, the gate dielectric 116 may be formed along the sidewalls of the individual, vertical access device pillars 121 using an atomic layer deposition (ALD) process to a thickness in a range of approximately 30 to 70 Å. Vertically oriented gates 114-1A and 114-1B, 114-2A and 114-2B, . . . , 114-NA and 114-NB (which may be collectively referred to as gates "114"), may be formed opposing the channel regions 104 of the vertical access device pillars 121. As shown in the example embodiment of FIG. 1D, a pair of gates, e.g., a first gate 114-1A, 114-2A, . . . , 114-NA (collectively referred to as "114A") and a second gate 114-1B, 114-2B, . . . , 114-NB (also collectively referred to as "114B"), are formed on opposing sides of the vertically access device pillars 121. The gates 114A/114B can be coupled to respective access lines, e.g., word lines.

In one example, the gate dielectric 116 may be conformally deposited over the vertically oriented access device pillars 121 and the working surface of the substrate material 101 using an ALD process, plasma enhanced CVD (PECVD), or other suitable deposition process, to cover the surfaces of the vertical access device pillar 121 and the surface of the substrate material 101. The gate dielectric 116 may be deposited to a particular thickness (t1) as suited to a particular design rule, e.g., a gate dielectric thickness of approximately 50 Angstroms (Å). Embodiments, however, are not limited to these example.

In one example, the gate dielectric 116 may comprise an aluminum oxide ($Al_2O_3$) material, a silicon dioxide ($SiO_2$) material, a silicon nitride material, a silicon oxynitride material, a high dielectric constant (k), e.g., high-k, dielectric material, etc. and/or combinations thereof. In some example embodiments, in high-k dielectric material examples the gate dielectric 116 may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobite, etc. However, embodiments are not so limited.

In some embodiments, the first and second gates 114A and 114B may be formed of a material such as a doped semiconductor material, e.g., doped silicon, doped germanium, etc. In some embodiments, the first and second gates 114A and 114B may comprise a semi-conductive metal nitride, e.g., titanium nitride (TiN), tantalum nitride (TaN), etc. In some embodiments, the first and second gates 114A and 114B comprise a metal such as tungsten (W), titanium (Ti), tantalum (Ta), etc. In some embodiments, the first and second gates 114A and 114B comprise a metal-semiconductor compound such as tungsten silicide ($WSi_2$), cobalt silicide ($CoSi_2$), titanium silicide ($TiSi_2$), etc. The first and second gates 114A and 114B may be deposited using an ALD process, CVD process, or other suitable semiconductor fabrication process. The first and second gates 114A and 114B may be formed to a particular thickness (t2) as suited to a particular design rule, e.g., a gate thickness of in a range of approximately 50 to 100 Angstroms (Å). Embodiments, however, are not limited to these examples.

As shown in the example embodiment of FIG. 1D, in some embodiments, a second dielectric 118-1, 118-2, . . . , 118-N (collectively referred to as "118") may be conformally deposited using a CVD process, PECVD, or other suitable deposition process, to cover the gate dielectric 116 and the first and second gates 114A and 114B. In some embodiments, the second dielectric 118 may comprise a silicon oxy-carbide ($SiO_xC_y$) material (also referred to herein as "SiOC"), a silicon oxy-nitride ($SiO_xN_y$) material (also referred to herein as "SiON"), a silicon dioxide ($SiO_2$) material, a silicon nitride ($Si_3N_4$) material (also referred to herein a "SiN"), and/or combinations thereof. Embodiments are not limited to these examples. According to embodiments, the second dielectric 118 is selected to have a particular selectively to certain etch chemistries.

Figure 1E:
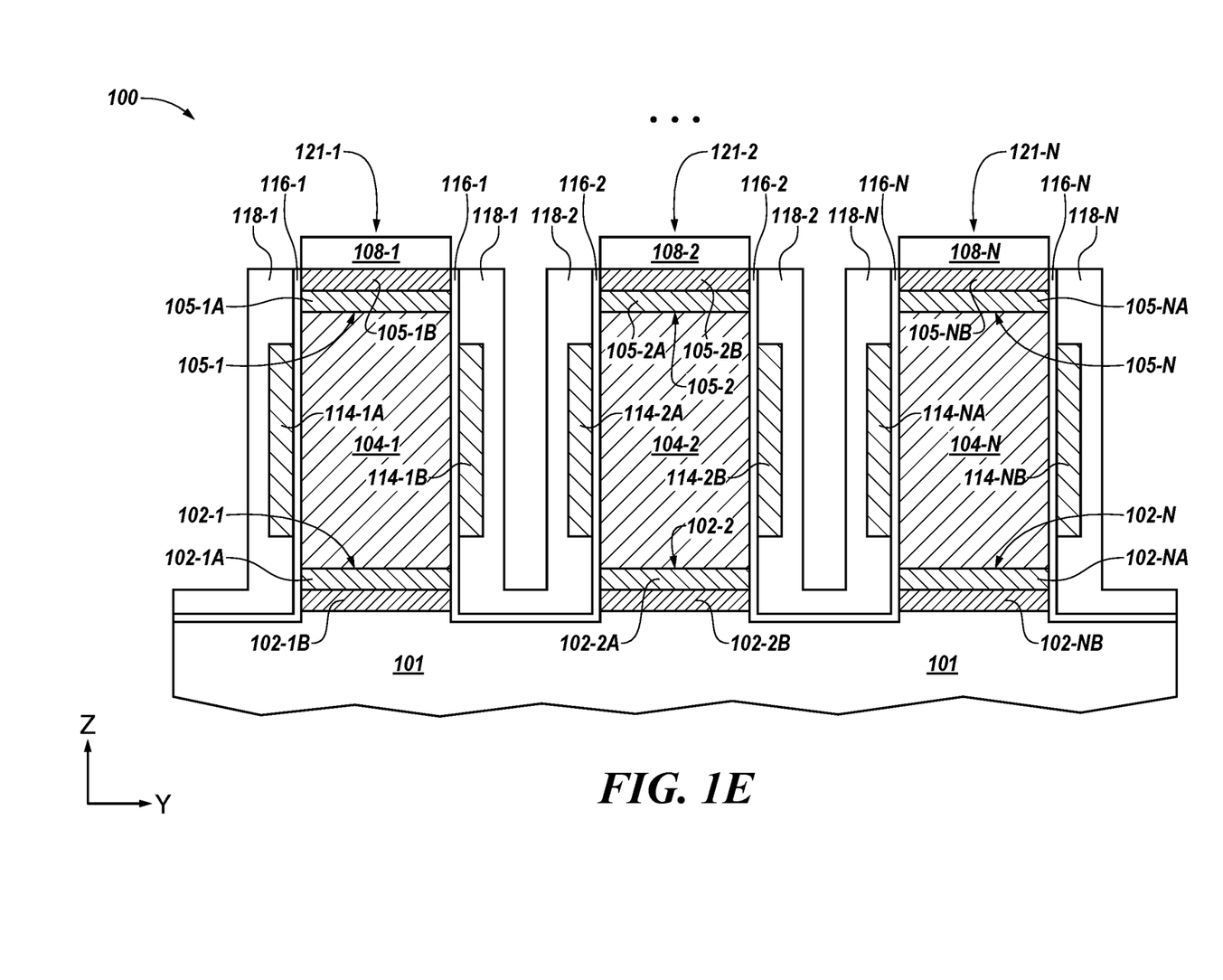
FIG. 1E is a cross-section view of a semiconductor structure at a particular point in time in an example semiconductor fabrication process in accordance with a number of embodiments of the present disclosure.

FIG. 1E is a cross-section view of a semiconductor structure at a particular point in time in an example semiconductor fabrication process 100 in accordance with a number of embodiments of the present disclosure. Fabrication process 100 illustrated in FIG. 1E shows removal of the dielectric layer 110 from the vertically access device pillar 121. As illustrated in FIG. 1E, a portion of the second dielectric 118, a portion of the gate dielectric 116, and the entire dielectric layer 110 may be removed. According to example embodiments, a portion of the second dielectric 118, a portion of the gate dielectric 116, and the entire dielectric layer 110 may be removed using a dry etch chemistry process.

In one embodiment, the dry etch chemistry process may include: a bromine based vapor, a chlorine based vapor, a fluorine based vapor and/or plasma etch (e.g., using gases like NF3, $NF_3/NH_3$/Ar, HBr, $CHF_3$), or SiConi™ clean. Embodiments, however, are not so limited. By way of example, a dry etch chemistry of oxygen ($O_2$) or $O_2$ and sulfur dioxide ($SO_2$) ($O_2/SO_2$) may be utilized to etch a portion of the second dielectric 118, a portion of the gate dielectric 116, and the entire dielectric layer 110. Thus, a portion of the second dielectric 118, a portion of the gate dielectric 116, and the entire dielectric layer 110 may be removed to form a top portion of the vertically access device pillar 121. As illustrated in FIG. 1E, the sacrificial etch stop layer 108, the first and second source/drain regions 102 and 105, the channel region 104, the first and second gates 114A and 114B, and portions of the gate dielectric 116 and the second dielectric 118 remain after the dry etch chemistry process is concluded.

In some embodiments, the dry etch process may cause the dielectric layer 110 to be removed and portions of the layer, e.g., sacrificial etch stop layer 108, under the dielectric layer 110 to be removed. According to embodiments, the sacrificial etch stop layer 108 serves as a stop layer for the dry etch process and prevents the dry etch process from damaging the second source/drain region 105 when exposing a contact surface to the second source/drain region 105. In some embodiments, the dry etch process stops at a surface of the sacrificial etch stop layer 108 upon reaching the sacrificial etch stop layer 108. In some embodiments, the dry etch process may stop in the sacrificial etch stop layer 108, e.g., after removing only a portion of the sacrificial etch stop layer 108.

According to embodiments, the sacrificial etch stop layer 108 material is chosen to have an etch process selectivity in a range of 200:1 to 800:1 to the second source/drain regions 105, e.g., when the sacrificial etch stop layer 108 is CVD-W and the second source/drain region 105 is indium oxide ($In_2O_3$). In some embodiments, a second region 105-1B, 105-2B, . . . , 105-NB (which may also be independently or collectively referred to herein as "105B") of the second source/drain region 105 is formed of a material such that the sacrificial etch stop layer 108 has an etch process selectivity in a range of 400:1 to 2400:1 of the sacrificial etch stop layer 108 to the second region 105B of the second source/drain region 105 for certain etch chemistries, e.g., when the sacrificial etch stop layer 108 is CVD-W and the second source/drain region 105 is indium tin oxide ($In_2O_5Sn$).

Figure 1F:
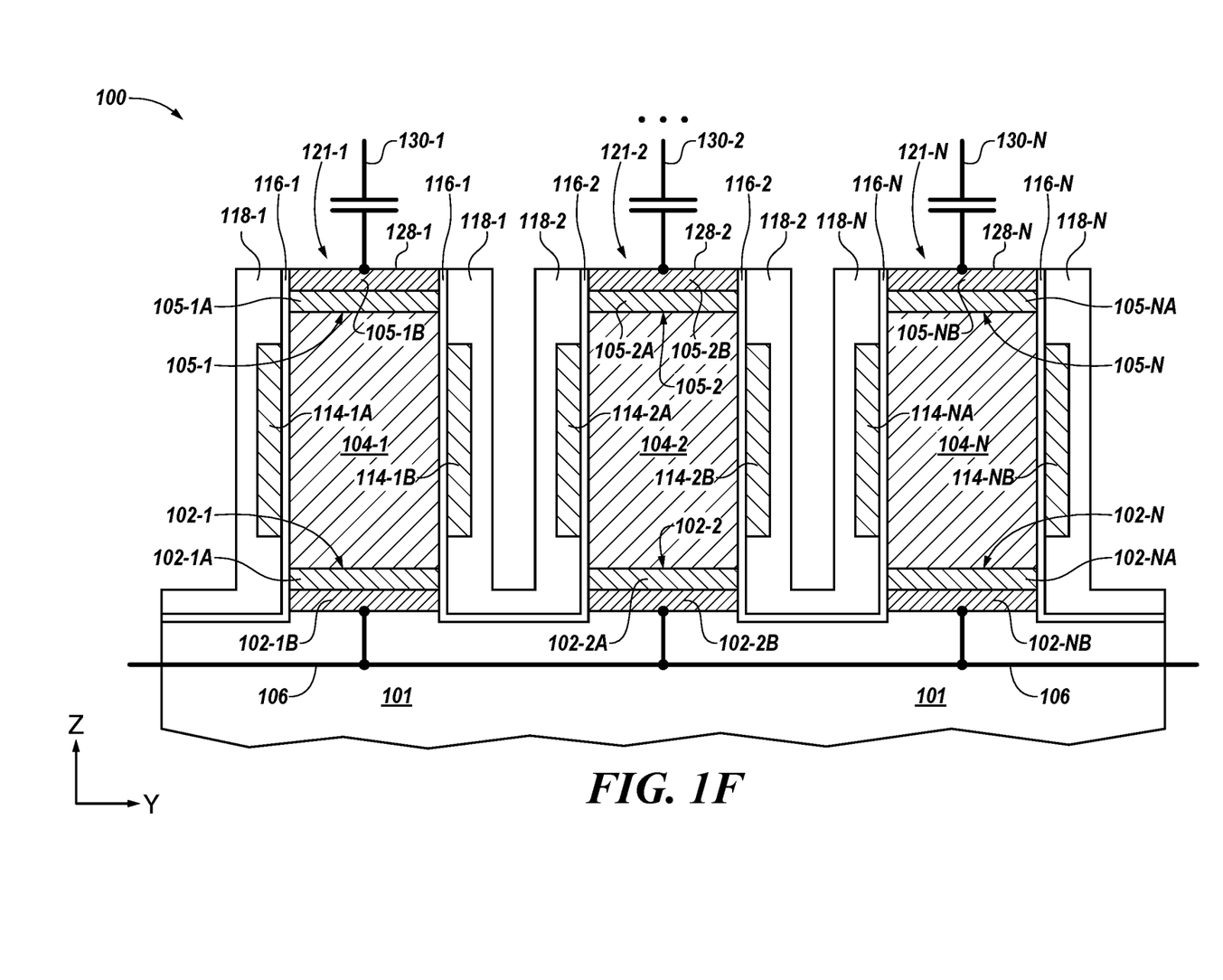
FIG. 1F is a cross-section view of a semiconductor structure at a particular point in time in an example semiconductor fabrication process in accordance with a number of embodiments of the present disclosure.

According to embodiments, a selected material, e.g., CVD-W, $Ga_2O_3$, ZnO, etc., for the sacrificial etch stop layer 108 with a particular wet etch chemistry, described below, with a high selectivity and compatibility to a selected material e.g., InOx, ITO, etc., of an outer surface layer, e.g., a top surface as shown in FIG. 1F of the second region 105B, of the second source/drain region 105 and channel region 104, e.g., IGZO, protects the second source/drain region 105 from damage that may result otherwise when exposing a contact surface, e.g., 128-1, 128-2, . . . , 128-N in FIG. 1F below, to the second source/drain region 105 during dry etch process. Thus, according to the material and etch chemistry embodiments described herein, the sacrificial etch stop layer 108 under the dielectric layer 110 provides enhanced protection to the second source/drain region 105 during the dry etch process.

FIG. 1F is a cross-section view of a semiconductor structure at a particular point in time in an example semiconductor fabrication process 100 in accordance with a number of embodiments of the present disclosure. Fabrication process 100 illustrated in FIG. 1F shows removal of the sacrificial etch stop layer 108 from the vertically access device pillar 121. In some embodiments, the sacrificial etch stop layer 108 may be removed using a wet etch chemistry process. As illustrated in FIG. 1F, the first and second source/drain regions 102 and 105, the channel region 104, the first and second gates 114A and 114B, and portions of the gate dielectric 116 and the second dielectric 118 may remain after the wet etch process is concluded.

According to embodiments, the wet etch process is selective to the sacrificial etch stop layer 108 material. Thus, the wet etch process may remove the sacrificial etch stop layer 108 with minimal or no damage to the second source/drain region 105. Again, according to embodiments, a selected material, e.g., CVD-W, $Ga_2O_3$, ZnO, etc., for the sacrificial etch stop layer 108 with a particular wet etch chemistry, described below, with a high selectivity and compatibility to a selected material e.g., InO, ITO, etc., of an outer surface layer, e.g., second region 105B, of the second source/drain region 105 and channel region 104, e.g., IGZO, protects the second source/drain region 105 from damage.

In one embodiment, the wet etch chemistry process may include: ammonium hydroxide ($NH_4OH$), hydrogen peroxide ($H_2O_2$), and/or combinations thereof, etc. Embodiments, however, are not so limited. By way of example, a wet etch chemistry mixture of ammonium hydroxide ($NH_4OH$), hydrogen peroxide ($H_2O_2$), and water ($H_2O$) may be utilized to etch the sacrificial etch stop layer 108. According to embodiments, the sacrificial etch stop layer 108 may be removed in a manner that is less destructive for exposing a contact surface, e.g., contact surface 128-1, 128-2, . . . , 128-N, on a top portion of the vertically access device pillar 121 to expose the second source/drain region 105.

In some embodiments, the second region 105B of the second source/drain region 105 may comprise material such that the sacrificial etch stop layer 108 has an etch process selectivity in a range of 400:1 to 2400:1 to the material of the second region 105B of the second source/drain region 105, e.g., when the sacrificial etch stop layer 108 is CVD-W and the second source/drain region 105 is indium tin oxide ($In_2O_5Sn$). In another embodiment, the second source/drain region 105 may comprise material such that the sacrificial etch stop layer 108 has an etch process selectivity in a range of 200:1 to 800:1 to the material of the second region 105B of the second source/drain region 105, e.g., when the sacrificial etch stop layer 108 is CVD-W and the second source/drain region 105 is indium tin oxide ($In_2O_3$). All individual values and subranges from 200:1 to 2400:1 are included; for example, the sacrificial etch stop layer 108 can have an etch process selectivity from a lower limit of 200:1, 250:1, 400:1, 445:1, 475:1, 500:1, 533:1, 550:1, 700:1, 750:1, 780:1, 800:1, 900:1 to an upper limit of 900:1, 1000:1, 1100:1, 1449:1, 1500:1, 1800:1, 1838:1, 2000:1, 2250:1, 2300:1, 2314:1.

In some embodiments, the selectivity of using a wet etch chemistry process of ammonium hydroxide ($NH_4OH$) and hydrogen peroxide ($H_2O_2$) (e.g., wet etch chemistry mixture Hot SC1) to remove a sacrificial etch stop layer 108 comprised of Tungsten (W) from a second region 105B comprised of indium oxide ($In_2O_3$) of a second source/drain region 105 is in a range of 750:1 to 800:1. In another embodiment, the selectivity of using a wet etch chemistry process of ammonium hydroxide ($NH_4OH$) and hydrogen peroxide ($H_2O_2$) (e.g., wet etch chemistry mixture Hot SC1) to remove a sacrificial etch stop layer 108 comprised of zinc oxide (ZnO) from a second region 105B comprised of indium oxide ($In_2O_3$) of a second source/drain region 105 is in a range of 200:1 to 300:1. In yet another embodiment, the selectivity of using a wet etch chemistry process of ammonium hydroxide ($NH_4OH$) and hydrogen peroxide ($H_2O_2$) (e.g., wet etch chemistry mixture Hot SC1) to remove a sacrificial etch stop layer 108 comprised of Tungsten (W) from a second region 105B comprised of indium tin oxide ($In_2O_5Sn$) of a second source/drain region 105 is in a range of 2200:1 to 2400:1. In another embodiment, the selectivity of using a wet etch chemistry process of ammonium hydroxide ($NH_4OH$) and hydrogen peroxide ($H_2O_2$) (e.g., wet etch chemistry mixture Hot SC1) to remove a sacrificial etch stop layer 108 comprised of zinc oxide (ZnO) from a second region 105B comprised of indium tin oxide ($In_2O_5Sn$) of a second source/drain region 105 is in a range of 750:1 to 800:1. In yet another embodiment, the selectivity of using a wet etch chemistry process of ammonium hydroxide ($NH_4OH$) and hydrogen peroxide ($H_2O_2$) (e.g., wet etch chemistry mixture Hot SC1) to remove a sacrificial etch stop layer 108 comprised of gallium oxide ($Ga_2O_3$) from a second region 105B comprised of indium tin oxide ($In_2O_5Sn$) of a second source/drain region 105 is in a range of 500:1 to 600:1.

In some embodiments, the selectivity of using a wet etch chemistry process of ammonium hydroxide ($NH_4OH$), hydrogen peroxide ($H_2O_2$), and water ($H_2O$) (e.g., wet etch chemistry mixture Hot DSC1) to remove a sacrificial etch stop layer 108 comprised of Tungsten (W) from a second region 105B comprised of indium oxide ($In_2O_3$) of a second source/drain region 105 is in a range of 350:1 to 450:1. In another embodiment, the selectivity of using a wet etch chemistry process of ammonium hydroxide ($NH_4OH$), hydrogen peroxide ($H_2O_2$), and water ($H_2O$) (e.g., wet etch chemistry mixture Hot DSC1) to remove a sacrificial etch stop layer 108 comprised of gallium oxide ($Ga_2O_3$) from a second region 105B comprised of indium oxide ($In_2O_3$) of a second source/drain region 105 is in a range of 200:1 to 300:1. In yet another embodiment, the selectivity of using a wet etch chemistry process of ammonium hydroxide ($NH_4OH$), hydrogen peroxide ($H_2O_2$), and water ($H_2O$) (e.g., wet etch chemistry mixture Hot DSC1) to remove a sacrificial etch stop layer 108 comprised of Tungsten (W) from a second region 105B comprised of indium tin oxide ($In_2O_5Sn$) of a second source/drain region 105 is in a range of 1750:1 to 1900:1. In another embodiment, the selectivity of using a wet etch chemistry process of ammonium hydroxide ($NH_4OH$), hydrogen peroxide ($H_2O_2$), and water ($H_2O$) (e.g., wet etch chemistry mixture Hot DSC1) to remove a sacrificial etch stop layer 108 comprised of gallium oxide ($Ga_2O_3$) from a second region 105B comprised of indium tin oxide ($In_2O_5Sn$) of a second source/drain region 105 is in a range of 1100:1 to 1200:1.

In another embodiment, the selectivity of using a wet etch chemistry process of ammonium hydroxide ($NH_4OH$) to remove a sacrificial etch stop layer 108 comprised of gallium oxide ($Ga_2O_3$) from a second region 105B comprised of indium oxide ($In_2O_3$) of a second source/drain region 105 is in a range of 400:1 to 500:1. In yet another embodiment, the selectivity of using a wet etch chemistry process of ammonium hydroxide ($NH_4OH$) to remove a sacrificial etch stop layer 108 comprised of gallium oxide ($Ga_2O_3$) from a second region 105B comprised of indium tin oxide ($In_2O_5Sn$) of a second source/drain region 105 is in a range of 400:1 to 500:1.

Once the sacrificial etch stop layer 108 is removed and the second source/drain region 105 is exposed creating a contact surface 128-1, 128-2, 128-N (collectively referred to herein as "128") on the first side of the second source/drain region 105 for a storage node 130-1, 130-2, . . . , 130-N (collectively referred to herein as "130"), e.g., capacitor, at one respective end of the vertical access device pillars 121. In some embodiments, using the selected etch stop materials, selected source/drain materials, and the particular wet etch chemistries to expose the second source/drain region 105 of the vertical access device pillars 121 results in an improved contact surface 128, e.g., contact landing pad, for electrical connection to a storage node 130, e.g., electrical connection to a node of a capacitor. The storage node 130 may be or include memory elements capable of storing data. According to embodiments, the storage nodes 130 may be a capacitor cell as shown in the example embodiment of FIG. 1F. However, embodiments for the use of the disclosed improved contact surface 128 described herein are not limited to exposing an improved contact surface 128 only as an electrical contact surface 128 to a storage node. Other uses may benefit from the techniques described herein.

In some embodiments, removing the sacrificial etch stop layer 108 using a wet etch process may expose a contact surface 128 on a second source/drain region 105 with a less rough and/or less damaged surface. For example, in some embodiments, using the techniques described herein, the exposed contact surface 128 on the second source/drain region 105 may have a less rough atomic surface, e.g., may have an surface with a roughness variation of less than 10 angstroms (Å). In addition, a contact surface 128, formed according to the embodiments described herein, can provide a contact surface 128 on the second source/drain region 105 that does not have a metallic dry etch residue due to using the wet etch process to remove the sacrificial etch stop layer 108.

Thus, the contact surface 128 of the second source/drain region 105 may provide an improved electrical contact surface 128 and as a result may provide for increased device performance when the sacrificial etch stop layer 108 with the selected wet etch process and source/drain regions described herein are utilized, as compared to an access device formed without such a sacrificial etch stop layer 108 and techniques, e.g., using only a dielectric protective layer and dry etch process to expose a contact surface to a storage cell side source/drain region.

As shown in FIG. 1F the first source/drain region 102 can be connected to a digit line 106. Although not shown in FIGS. 1A-1E, one of ordinary skill in the art will appreciate that the digit line 106 can be formed in substrate material 101 prior to formation of the prior to formation of the access device pillars 121 and storage nodes 130.

FIG. 2 is a functional block diagram of a system 260 for implementation of an example semiconductor fabrication process in accordance with a number of embodiments of the present disclosure. The system 260 may include a processing apparatus 261. The processing apparatus 261 may be configured to enable formation of a semiconductor recess.

The processing apparatus 261 may include a semiconductor processing chamber 262 to enclose components configured to form a semiconductor recess. The semiconductor processing chamber 262 may further enclose a carrier 263 to hold a batch of semiconductor wafers 264 (e.g., the substrate material 101). The processing apparatus 261 may include and/or be associated with tools including, for example, a pump 265 unit and a purge 266 unit configured to introduce and remove reducing agents. The processing apparatus 261 may further include a temperature control 267 unit configured to maintain the semiconductor processing chamber 262 at appropriate temperatures.

The system 260 may further include a controller 268. The controller 268 may include, or be associated with, circuitry and/or programming for implementation of deposition and removal of materials using chemistries and materials described herein. For example, controlling exposure of a contact surface (e.g., contact surface 128 of FIG. 1G), as describe herein. Adjustment of such deposition and removal operations by the controller 268 may control and improve the quality and electrical properties of the exposed contact surface (e.g., contact surface 128 of FIG. 1G) of the storage cell side second source/drain region (e.g., second source/drain region 105 of FIG. 1A), 128 in FIG. 1G.

The controller 268 may, in a number of embodiments, be configured to use hardware as control circuitry. Such control circuitry may, for example, be an application specific integrated circuit (ASIC) with logic to control fabrication steps, via associated material deposition and etch chemistry removal processes, for formation of an improved contact surface (e.g., contact surface 128 of FIG. 1G), as described herein.

Figure 3:
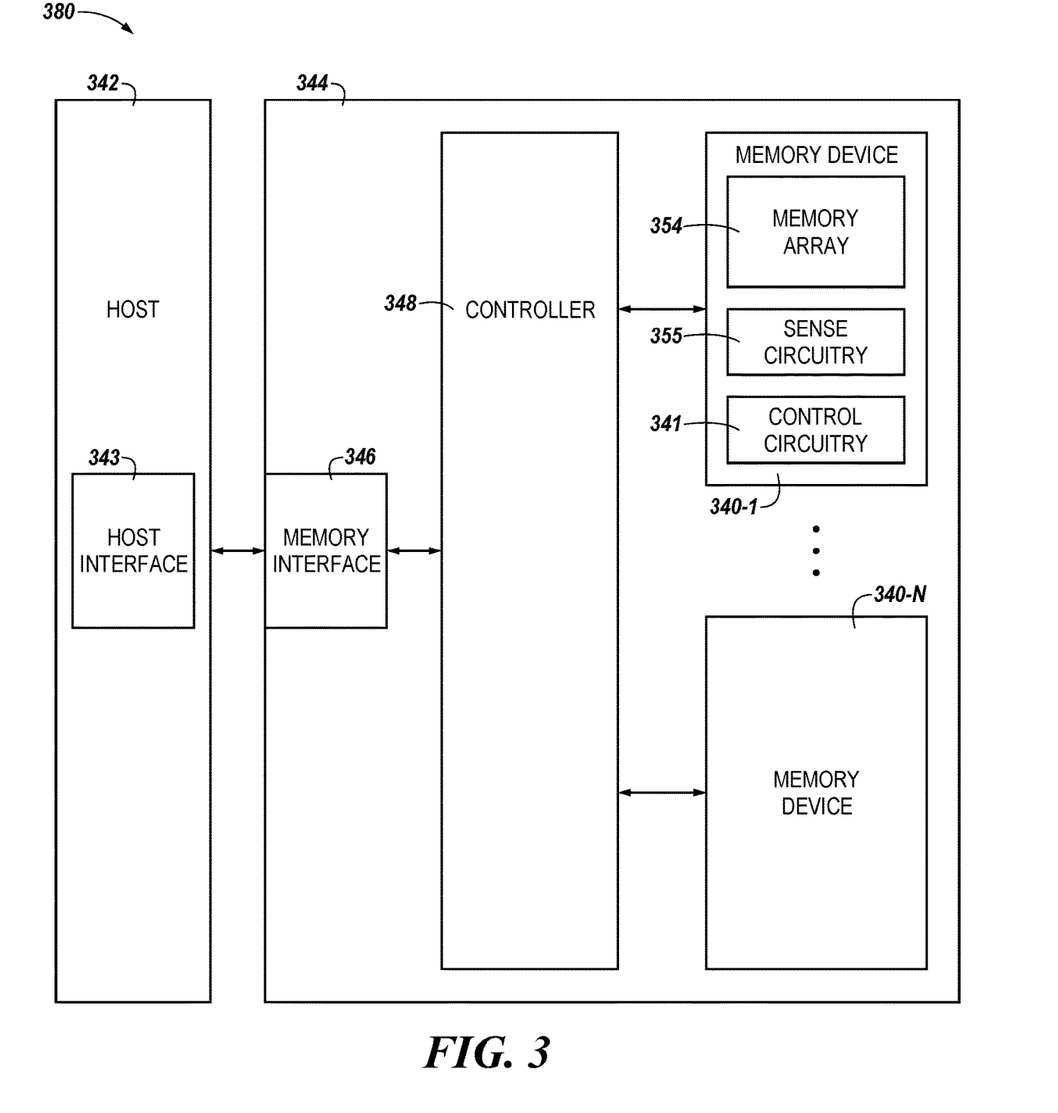
FIG. 3 is a functional block diagram of a computing system including at least one memory array having a structure formed in accordance with one or more examples of the present disclosure.

FIG. 3 is a functional block diagram of a computing system 380 including at least one memory array 354 having a structure (e.g., contact surface 128 of FIG. 1G) for electrical contact to a storage node, formed in accordance with one or more examples of the present disclosure. The computing system 380 may comprise a memory device, e.g., 340-1, in a memory 344 associated with a host 342 for use as a solid-state drive (SSD).

In the example illustrated in FIG. 3, the computing system 380 can include a memory interface 346, a number of memory devices 340-1, . . . , 340-N, and a controller 348 selectively coupled to the memory interface 346 and memory devices 340-1, . . . , 340-N. Memory interface 346 may be used to communicate information between the memory 344 and another device, such as a host 342. Host 342 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like.

Memory interface 346 may be in the form of a standardized physical interface. For example, when the memory 344 is used for information (e.g., data) storage in computing system 380, memory interface 346 may be a serial advanced technology attachment (SATA) interface, a peripheral component interconnect express (PCIe) interface, or a universal serial bus (USB) interface, among other physical connectors and/or interfaces. In general, however, memory interface 346 may provide an interface for passing control, address, information, scaled preferences, and/or other signals between the controller 348 of the memory 344 and a host 342 (e.g., via host interface 343).

Controller 348 may include, for example, firmware and/or control circuitry (e.g., hardware). Controller 348 may be operably coupled to and/or included on the same physical device (e.g., a die) as one or more of the memory devices 340-1, . . . , 340-N. For example, controller 348 may be, or may include, an ASIC as hardware operably coupled to circuitry (e.g., a printed circuit board) including memory interface 346 and memory devices 340-1, . . . , 340-N. Alternatively, controller 348 may be included on a separate physical device that is communicatively coupled to the physical device (e.g., the die) that includes one or more of the memory devices 340-1, . . . , 340-N.

Controller 348 may communicate with memory devices 340-1, . . . , 340-N to direct operations to sense (e.g., read), program (e.g., write), and/or erase information, among other functions and/or operations for management of memory cells. Controller 348 may have circuitry that may include a number of integrated circuits and/or discrete components. In a number of examples, the circuitry in controller 348 may include control circuitry for controlling access across memory devices 340-1, . . . , 340-N and/or circuitry for providing a translation layer between host 342 and the memory 344.

Memory devices 340-1, . . . , 340-N may include, for example, memory array 354, e.g., arrays of volatile memory such as dynamic random access memory (DRAM) memory. However, the improved contact surface exposure techniques described herein may also have application for non-volatile memory cells. Embodiments are not so limited. As will be appreciated, the memory cells in the memory array 354 of memory devices 340-1, . . . , 340-N may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture.

Memory devices 340-1, . . . , 340-N may be formed on the same die. A memory device (e.g., memory device 340-1) may include one or more arrays of memory cells (e.g., memory array 354) formed on the die. A memory device may include sense circuitry 355 and control circuitry 341 associated with one or more arrays (e.g., memory array 354) formed on the die, or portions thereof. The sense circuitry 355 may be utilized to determine (sense) a particular data value (e.g., 0 or 1) that is stored at a particular memory cell in a row of an array (e.g., memory array 354). The control circuitry 341 may be utilized to direct the sense circuitry 355 to sense particular data values, in addition to directing storage, erasure, etc., of data values in response to a command from host 342 and/or host interface 343. The command may be sent directly to the control circuitry 341 via the memory interface 346 or to the control circuitry 341 via the controller 348.

The example illustrated in FIG. 3 may include additional circuitry that is not illustrated so as not to obscure examples of the present disclosure. For example, memory devices 340-1, . . . , 340-N may include address circuitry to latch address signals provided over I/O connectors through I/O circuitry. Address signals may be received and decoded by a row decoder and a column decoder to access a memory array 354. It will be appreciated that the number of address input connectors may depend on the density and/or architecture of memory devices 340-1, . . . , 340-N and/or memory array 354.

In the detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

While example embodiments including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, openings and/or trenches, among other materials and/or components, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, openings and/or trenches than those disclosed herein are expressly included within the scope of this disclosure.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a contact surface to a vertically oriented access device, comprising:
    forming a first source/drain region and a second source/drain region vertically separated by a channel region;
    forming a sacrificial etch stop layer on a first side of the second source/drain region, wherein the channel region is in contact with a second side of the second source/drain region;
    forming a dielectric layer on a first side of the sacrificial etch stop layer, wherein the second source/drain region is connected to a second side of the sacrificial etch stop layer;
    forming a gate vertically opposing the channel region of the vertically oriented access device, wherein the gate is separated from the channel region by a gate dielectric;
    removing the dielectric layer using a first etch process to expose the sacrificial etch stop layer; and
    removing the sacrificial etch stop layer using a second etch process to expose a contact surface on the second source/drain region.

2. The method of claim 1, wherein further comprising removing the sacrificial etch stop layer to expose the contact surface on the second source/drain region for an electrical connection to a storage node.

3. The method of claim 1, further comprising depositing a tungsten (W) material as the sacrificial etch stop layer.

4. The method of claim 1, further comprising forming the sacrificial etch stop layer using a metallic oxide.

5. The method of claim 4, further comprising using a plasma vapor deposition (PVD) process to deposit gallium oxide ($Ga_2O_3$) as the metallic oxide.

6. The method of claim 1, further comprising using a dry etch process as the first etch process to remove the dielectric layer and stopping on or within the sacrificial etch stop layer.

7. The method of claim 6, further comprising using a gas including fluorine as a dry etch in the dry etch process to expose the sacrificial etch stop layer.

8. The method of claim 1, further comprising removing the sacrificial etch stop layer using a wet etch process as the second etch process.

9. The method of claim 8, further comprising using a mixture of ammonium hydroxide ($NH_4OH$) and hydrogen peroxide ($H_2O_2$) as a wet etch in the wet etch process to remove the sacrificial etch stop layer and expose the second source/drain region.

10. The method of claim 1, further comprising depositing a silicon nitride ($Si_3N_4$) material as the dielectric layer.

11. A method of forming a contact surface for a vertically oriented access device, comprising:
    vertically forming a first source/drain region, a channel region on the first source/drain region, and a second source/drain region on the channel region;
    forming a sacrificial etch stop layer including tungsten (W) on the second source/drain region;
    forming a dielectric layer on the sacrificial etch stop layer;

forming a gate vertically opposing the channel region of the vertically oriented access device, wherein the gate is separated from the channel region by a gate dielectric;

removing the dielectric layer using a dry etch process to expose the sacrificial etch stop layer; and removing the sacrificial etch stop layer using a wet etch process to expose the contact surface on the second source/drain region.

12. The method of claim 11, further comprising forming the first source/drain region and second source/drain region as a multi-layer source/drain region.

13. The method of claim 12, further comprising forming a first region of the first source/drain region and a first region of the second source/drain region from a same material.

14. The method of claim 12, further comprising forming a second region of the first source/drain region and a second region of the second source/drain region from a same material.

15. The method of claim 11, further comprising forming the gate comprised of titanium nitride (TiN) to vertically oppose the channel region, wherein the gate and the channel region are separated by the gate dielectric comprised of an aluminum oxide ($Al_2O_3$) material.

16. The method of claim 11, further comprising using ammonium hydroxide ($NH_4OH$) as a wet etch in the wet etch process to remove the sacrificial etch stop layer and exposed the second source/drain region.

17. The method of claim 11, further comprising using a mixture of ammonium hydroxide ($NH_4OH$), hydrogen peroxide ($H_2O_2$), and water ($H_2O$) as a wet etch in the wet etch process to remove the sacrificial etch stop layer and expose the second source/drain region.

18. A method of forming memory cells having vertically oriented access devices, comprising:

sequentially depositing a first source/drain region, a channel region, and a second source/drain region to form a vertically oriented structure, wherein the first source/drain region and the second source/drain region are vertically separated by the channel region;

forming a sacrificial etch stop layer including tungsten (W) on the second source/drain region;

forming a dielectric layer on the sacrificial etch stop layer;

forming a gate dielectric over the dielectric layer and the sequentially deposited first source/drain region, channel region, and second source/drain region of the vertically oriented structure;

forming vertical gates opposing the channel region along side the vertically oriented structure and separated from the channel region by the gate dielectric;

depositing a second dielectric over the gate dielectric and the vertical gates;

removing the dielectric layer and the second dielectric using a dry etch process to expose the sacrificial etch stop layer; and removing the sacrificial etch stop layer using a wet etch chemistry having a high selectivity to the sacrificial etch stop layer relative to the second source/drain region and a compatibility with the channel region to expose a contact surface on the second source/drain region for electrical connection to a storage node.

19. The method of claim 18, further comprising:

using a chemical vapor deposition (CVD) process to deposit a sacrificial etch stop layer; and removing the sacrificial etch stop layer using a mixture of ammonium hydroxide ($NH_4OH$) and hydrogen peroxide ($H_2O_2$) as a wet etch in the wet etch chemistry.

20. The method of claim 18, further comprising using a gas including fluorine, as a dry etch in the dry etch process to expose the sacrificial etch stop layer.

\* \* \* \* \*